(12) United States Patent
Kim et al.

(10) Patent No.: US 10,523,386 B2
(45) Date of Patent: Dec. 31, 2019

(54) METHOD OF PROCESSING DATA BLOCK IN WIRELESS COMMUNICATION SYSTEM AND APPARATUS THEREFOR

(71) Applicant: LG ELECTRONICS INC., Seoul (KR)

(72) Inventors: Bonghoe Kim, Seoul (KR); Soocheol Kyeong, Seoul (KR); Kijun Kim, Seoul (KR); Byounghoon Kim, Seoul (KR); Jinwoo Kim, Seoul (KR); Kwangseok Noh, Seoul (KR); Ilmu Byun, Seoul (KR); Joonkui Ahn, Seoul (KR); Seunggye Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 121 days.

(21) Appl. No.: 15/628,265

(22) Filed: Jun. 20, 2017

(65) Prior Publication Data

US 2017/0373809 A1 Dec. 28, 2017

Related U.S. Application Data

(60) Provisional application No. 62/354,130, filed on Jun. 24, 2016, provisional application No. 62/409,896, (Continued)

(51) Int. Cl.
*H03M 13/29* (2006.01)
*H04L 5/00* (2006.01)
(Continued)

(52) U.S. Cl.
CPC ....... *H04L 5/0044* (2013.01); *H03M 13/1148* (2013.01); *H04L 1/0058* (2013.01); *H04L 1/0059* (2013.01); *H04L 1/0071* (2013.01)

(58) Field of Classification Search
CPC ........... H03M 13/005; H03M 13/1148; H03M 13/296; H03M 13/2993; H03M 13/6362; H04L 1/0058; H04L 1/0059; H04L 1/0066; H04L 1/0067; H04L 1/0071; H04L 1/1819; H04L 5/001; H04L 5/0023; H04L 5/0044
See application file for complete search history.

(56) References Cited

U.S. PATENT DOCUMENTS

2002/0015419 A1* 2/2002 Kim .................... H04L 1/005
370/468
2005/0172202 A1* 8/2005 Eroz ................. H03M 13/2957
714/755

(Continued)

*Primary Examiner* — Andrew Lai
*Assistant Examiner* — M Mostazir Rahman
(74) *Attorney, Agent, or Firm* — Birch, Stewart, Kolasch & Birch, LLP

(57) ABSTRACT

A method for processing a data block by a user equipment in a wireless communication system comprises generating tail bits of 18 bits by performing trellis termination in a turbo encoder of code rate 1/5 containing a plurality of constituent encoders; and deploying the tail bits of 18 bits to 5 encoded bit sequences of the turbo encoder according to a prescribed rule, wherein 4 tail bits are deployed to a systematic bit sequence among the 5 encoded bit sequences according to the prescribed rule, and 4 tail bits are deployed to each of specific 2 parity bit sequences among 4 parity bit sequences according to the prescribed rule.

8 Claims, 13 Drawing Sheets

Related U.S. Application Data filed on Oct. 19, 2016, provisional application No. 62/417,364, filed on Nov. 4, 2016, provisional application No. 62/521,559, filed on Jun. 19, 2017.

(51) Int. Cl.
*H04L 1/00* (2006.01)
*H03M 13/11* (2006.01)

(56) References Cited

U.S. PATENT DOCUMENTS

| | | | | |
|---|---|---|---|---|
| 2009/0106618 A1* | 4/2009 | Lin | ............... | H03M 13/2957 |
| | | | | 714/748 |
| 2010/0318878 A1* | 12/2010 | Mansour | ............ | H03M 13/2714 |
| | | | | 714/755 |
| 2012/0233519 A1* | 9/2012 | Eroz | ............... | H03M 13/2903 |
| | | | | 714/755 |
| 2014/0047295 A1* | 2/2014 | Shinohara | ............ | H03M 13/1165 |
| | | | | 714/752 |
| 2016/0099796 A1* | 4/2016 | Yang | ............ | H03M 13/1177 |
| | | | | 714/776 |
| 2017/0111139 A1* | 4/2017 | Greenberg | ............ | H04L 1/0009 |

\* cited by examiner

FIG. 12
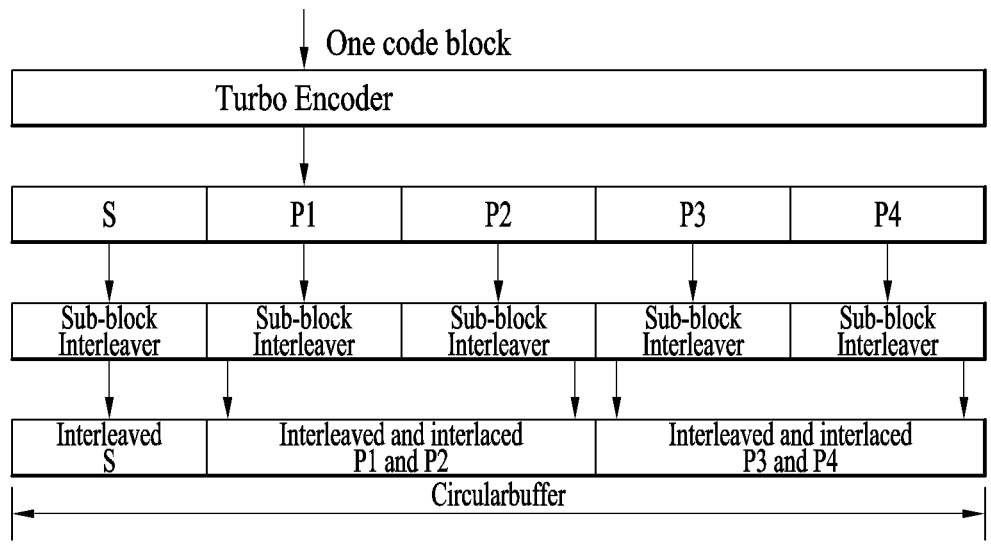
(a) Option 1
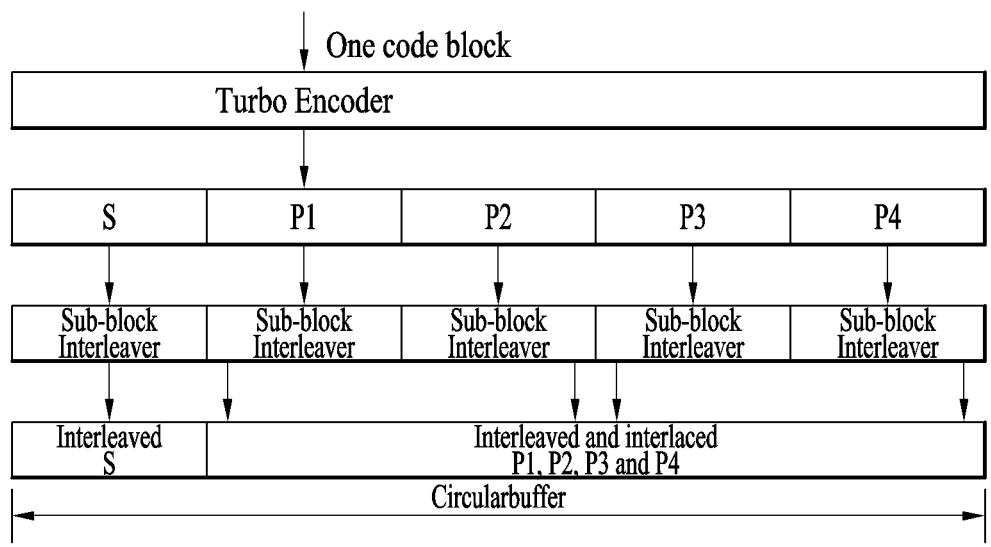
(b) Option 2

METHOD OF PROCESSING DATA BLOCK IN WIRELESS COMMUNICATION SYSTEM AND APPARATUS THEREFOR

CROSS-REFERENCE TO RELATED APPLICATIONS

This application claims the priority benefit of U.S. Provisional Application No. 62/354,130 filed on Jun. 24, 2016, U.S. Provisional Application No. 62/409,896 filed on Oct. 19, 2016, U.S. Provisional Application No. 62/417,364 filed on Nov. 4, 2016, and U.S. Provisional Application No. 62/521,559 filed on Jun. 19, 2017, all of which are hereby incorporated by reference as if fully set forth herein.

BACKGROUND OF THE INVENTION

Field of the Invention

The present invention relates to a wireless communication system, and more particularly, to a method of processing a data block and a communication apparatus therefor.

Discussion of the Related Art

In a next generation 5G system, scenarios can be classified by enhanced Mobile BroadBand (eMBB), ultra-reliable Machine-Type Communications (uMTC), massive Machine-Type Communications (mMTC), and the like. The eMBB corresponds to a next generation mobile communication scenario having characteristics such as high spectrum efficiency, high user experienced data rate, high peak data rate, and the like. The uMTC corresponds to a next generation mobile communication scenario having characteristics such as ultra-reliable, ultra-low latency, ultra-high availability, and the like (e.g., V2X, emergency service, remote control). The mMTC corresponds to a next generation mobile communication scenario having characteristics such as low cost, low energy, short packet, and massive connectivity.

The present invention proposes a coding scheme for providing various services in a 5G system or a New RAT (NR) system.

SUMMARY OF THE INVENTION

Accordingly, the present invention is directed to an apparatus and method thereof that substantially obviate one or more problems due to limitations and disadvantages of the related art.

A technical task of the present invention is to provide a method for a UE to process a data block in a wireless communication system according to one embodiment of the present invention.

Another technical task of the present invention is to provide a method for a UE to process a data block in a wireless communication system according to a different embodiment of the present invention.

Another technical task of the present invention is to provide a method for a communication device to process a data block in a wireless communication system.

Another technical task of the present invention is to provide a UE configured to process a data block in a wireless communication system according to one embodiment of the present invention.

Another technical task of the present invention is to provide a UE configured to process a data block in a wireless communication system according to a different embodiment of the present invention.

The other technical task of the present invention is to provide a communication device configured to process a data block in a wireless communication system.

Technical tasks obtainable from the present invention are non-limited the above-mentioned technical task. And, other unmentioned technical tasks can be clearly understood from the following description by those having ordinary skill in the technical field to which the present invention pertains.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, according to one embodiment, a method of processing a data block, which is processed by a user equipment in a wireless communication system, includes the steps of generating tail bits of 18 bits by performing trellis termination in a turbo encoder of code rate 1/5 containing a plurality of constituent encoders; and deploying the tail bits of 18 bits to 5 encoded bit sequences of the turbo encoder according to a prescribed rule, wherein 4 tail bits are deployed to a systematic bit sequence among the 5 encoded bit sequences according to the prescribed rule, and 4 tail bits are deployed to each of specific 2 parity bit sequences among 4 parity bit sequences according to the prescribed rule.

3 tail bits are deployed to each of the remaining 2 parity bit sequences, or wherein 1 bit corresponding to a systematic bit of a first constituent encoder among a plurality of the constituent encoders is further deployed to a first parity bit sequence among the remaining 2 parity bit sequences and 1 bit corresponding to a systematic bit of a second constituent encoder is further deployed to a second parity bit sequence.

The method can further include the step of grouping in a unit of 2 parity bit sequences among the 4 parity bit sequences; performing interleaving and interlacing on parity bits per group.

Or, the method can further include the step of performing interleaving and interlacing on all parity bits by grouping the 4 parity bit sequences as a group.

If the turbo encoder of code rate 1/5 is used, a redundancy version (RV) starting position can be determined by an equation A in the following.

$$k_0 = R_{subblock}^{TC} \cdot \left(2 \cdot \left\lceil \frac{N_{cb}}{8R_{subblock}^{TC}} \right\rceil \cdot rv_{idx} + 4\right) \quad \text{[Equation A]}$$

where, $N_{cb}$ corresponds to a size of a code block, $rv_{idx}$ has values of 0, 1, 2, and 3, and $R_{subblock}^{TC}$ corresponds to the number of rows of a sub-block interleaver To further achieve these objects and other advantages and in accordance with the purpose of the invention, as embodied and broadly described herein, according to a different embodiment, a method for processing a data block, which is processed by a user equipment in a wireless communication system, includes the steps of determining whether a encoder of code rate 1/5 or a encoder of code rate 1/3 is used based on a size of a code block (CB) or a transport block (TB) corresponding to a size of a data block, and processing the data block using the determined encoder. If the size of the CB or the TB is greater than a prescribed threshold size, the encoder of code rate 1/3 can be determined to be used for processing the data block. If the size of the CB or the TB is equal to or less than the prescribed threshold size, the encoder of code rate 1/5 can be determined to be used for processing the data block.

To further achieve these objects and other advantages and in accordance with the purpose of the invention, as embodied and broadly described herein, according to a further different embodiment, a method for processing a data block, which is processed by a communication device in a wireless communication system, includes the step of, if data, which is not a code rate 1/3, is transmitted via a tail biting convolutional code (TBCC) encoder of the code rate 1/3, performing rate matching in a manner of performing puncturing or repetition on a prescribed encoded bit among parity bit sequences in the TBCC encoder. In this case, if the data corresponds to data of a coder rate greater than the code rate 1/3, a prescribed coded bit is punctured in each of the parity bit sequences and if the data corresponds to data of a coder rate smaller than the code rate 1/3, a prescribed bit can be repeated in each of the parity bit sequences.

If the amount of coded bits to be punctured corresponds to a multiple of 3, the same amount of coded bits is punctured in each of the parity bit sequences, whereas if the amount of coded bits to be punctured is not a multiple of 3, the amount of coded bits to be punctured in each of the parity bit sequences can be punctured to have a maximum 1 bit difference.

If the amount of coded bits to be repeated corresponds to a multiple of 3, the same amount of coded bits is repeated in each of the parity bit sequences, whereas if the amount of coded bits to be repeated is not a multiple of 3, the amount of coded bits to be repeated in each of the parity bit sequences can be repeated to have a maximum 1 bit difference.

To further achieve these objects and other advantages and in accordance with the purpose of the invention, as embodied and broadly described herein, according to a further different embodiment, a user equipment for processing a data block in a wireless communication system includes a processor configured to generate tail bits of 18 bits by performing trellis termination in a turbo encoder of code rate 1/5 containing a plurality of constituent encoders, the processor configured to deploy the tail bits of 18 bits to 5 encoded bit sequences of the turbo encoder according to a prescribed rule, wherein 4 tail bits are deployed to a systematic bit sequence among the 5 encoded bit sequences according to the prescribed rule, and 4 tail bits are deployed to each of specific 2 parity bit sequences among 4 parity bit sequences according to the prescribed rule.

The processor is configured to further deploy 3 tail bits to the remaining 2 parity bit sequences, or wherein the processor is configured to further deploy 1 bit corresponding to a systematic bit of a first constituent encoder among a plurality of the constituent encoders to a first parity bit sequence among the remaining 2 parity bit sequences and further deploy 1 bit corresponding to a systematic bit of a second constituent encoder to a second parity bit sequence.

The processor is configured to group in a unit of 2 parity bit sequences among the 4 parity bit sequences; and perform interleaving and interlacing on parity bits per group. The processor is configured to perform interleaving and interlacing on all parity bits by grouping the 4 parity bit sequences as a group.

To further achieve these objects and other advantages and in accordance with the purpose of the invention, as embodied and broadly described herein, according to a further different embodiment, a user equipment for processing a data block in a wireless communication system includes a processor configured to determine whether a encoder of code rate 1/5 or a encoder of code rate 1/3 is used based on a size of a code block (CB) or a transport block (TB) corresponding to a size of a data block and process the data block using the determined encoder.

If data, which is not a code rate 1/3, is transmitted via a tail biting convolutional code (TBCC) encoder of the code rate 1/3, a communication device for processing a data block in a wireless communication system includes a processor configured to perform rate matching in a manner of performing puncturing or repetition on a prescribed encoded bit among parity bit sequences in the TBCC encoder.

If the data corresponds to data of a coder rate greater than the code rate 1/3, the processor is configured to puncture a prescribed coded bit in each of the parity bit sequences and if the data corresponds to data of a coder rate smaller than the code rate 1/3, the processor is configured to repeat a prescribed bit in each of the parity bit sequences.

To further achieve these objects and other advantages and in accordance with the purpose of the invention, as embodied and broadly described herein, according to a further different embodiment, a method for processing a data block by a user equipment in a wireless communication system comprise determining a low-density parity-check (LDPC) code to be used based on a data block size and a MCS index; and if the data block size is less than a specific value and the MCS index is greater than a prescribed value in same modulation scheme, processing the data block using a LPDC code 1, and if the data block size is less than the specific value and the MCS index is the prescribed value or less in same modulation scheme, processing the data block using a LPDC code 2.

To further achieve these objects and other advantages and in accordance with the purpose of the invention, as embodied and broadly described herein, according to a further different embodiment, a user equipment for processing a data block by a user equipment in a wireless communication system comprises a processor configured to: determine a low-density parity-check (LDPC) code to be used based on a data block size and a MCS index; and if the data block size is less than a specific value and the MCS index is greater than a prescribed value in same modulation scheme, process the data block using a LPDC code 1, and if the data block size is less than the specific value and the MCS index is the prescribed value or less in same modulation scheme, process the data block using a LPDC code 2.

According to the present invention, it is able to efficiently process a data block according to a coding scheme of a turbo encoder and a TBCC coding scheme proposed in the present invention.

Effects obtainable from the present invention may be non-limited by the above mentioned effect. And, other unmentioned effects can be clearly understood from the following description by those having ordinary skill in the technical field to which the present invention pertains.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 12 is a diagram for a method of storing a bit stream generated by 1/5 turbo encoder in a circular buffer.

DETAILED DESCRIPTION OF THE INVENTION

Figure 1:
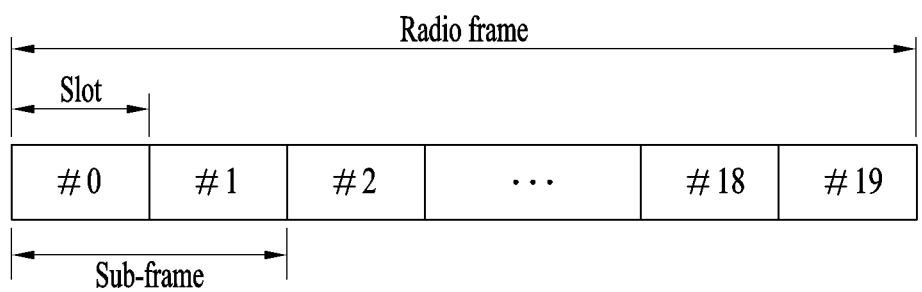
FIG. 1 illustrates a structure of a radio frame of 3GPP LTE.

Reference will now be made in detail to the preferred embodiments of the present invention, examples of which are illustrated in the accompanying drawings. In the following detailed description of the invention includes details to help the full understanding of the present invention. Yet, it is apparent to those skilled in the art that the present invention can be implemented without these details. For instance, although the following descriptions are made in detail on the assumption that a mobile communication system includes 3GPP LTE system, LTE-A, 5G system, and the like, the following descriptions are applicable to other random mobile communication systems in a manner of excluding unique features of the 3GPP LTE, the LTE-A, and the 5G communication system.

Occasionally, to prevent the present invention from getting vaguer, structures and/or devices known to the public are skipped or can be represented as block diagrams centering on the core functions of the structures and/or devices. Wherever possible, the same reference numbers will be used throughout the drawings to refer to the same or like parts.

Moreover, specific terminologies used in the following descriptions are provided to help understand the present invention. The use of the specific terminologies can be changed by a different form within a range not deviating from the technical idea of the present invention.

Besides, in the following description, assume that a terminal is a common name of such a mobile or fixed user stage device as a user equipment (UE), a mobile station (MS), an advanced mobile station (AMS) and the like. And, assume that a base station (BS) is a common name of such a random node of a network stage communicating with a terminal as a Node B (NB), an eNode B (eNB), an access point (AP) and the like.

In a mobile communication system, a user equipment is able to receive information from a base station in downlink and is able to transmit information to the base station in uplink. The information transmitted or received by the user equipment may include various kinds of data and control information. In accordance with types and usages of the information transmitted or received by the user equipment, various physical channels may exist.

Techniques, apparatus and systems described herein can be used in various wireless access technologies such as code division multiple access (CDMA), frequency division multiple access (FDMA), time division multiple access (TDMA), orthogonal frequency division multiple access (OFDMA), single carrier frequency division multiple access (SC-FDMA), etc. The CDMA may be implemented with a radio technology such as Universal Terrestrial Radio Access (UTRA) or CDMA2000. The TDMA may be implemented with a radio technology such as Global System for Mobile communications (GSM)/General Packet Radio Service (GPRS)/Enhanced Data Rates for GSM Evolution (EDGE). The OFDMA may be implemented with a radio technology such as institute of electrical and electronics engineers (IEEE) 802.11 (Wi-Fi), IEEE 802.16 (WiMAX), IEEE 802-20, evolved-UTRA (E-UTRA) etc. The UTRA is a part of a universal mobile telecommunication system (UMTS). 3rd generation partnership project (3GPP) long term evolution (LTE) is a part of an evolved-UMTS (E-UMTS) using the E-UTRA. The 3GPP LTE employs the OFDMA in downlink and employs the SC-FDMA in uplink [1]. LTE-advanced (LTE-A) is an evolution of the 3GPP LTE. For clarity, this application focuses on the 3GPP LTE/LTE-A. However, technical features of the present invention are not limited thereto.

FIG. 1 illustrates a structure of a radio frame of 3GPP LTE.

In FIG. 1, a radio frame includes 10 subframes. A subframe includes two slots in time domain. A time for transmitting one subframe is defined as a transmission time interval (TTI). For example, one subframe may have a length of 1 millisecond (ms), and one slot may have a length of 0.5 ms. One slot includes a plurality of orthogonal frequency division multiplexing (OFDM) symbols in time domain. Since the 3GPP LTE uses the OFDMA in the downlink, the OFDM symbol is for representing one symbol period. The OFDM symbol may also be referred to as an SC-FDMA symbol or a symbol period. A resource block (RB) is a resource allocation unit, and includes a plurality of contiguous subcarriers in one slot. The structure of the radio frame is shown for exemplary purposes only. Thus, the number of subframes included in the radio frame or the number of slots included in the subframe or the number of OFDM symbols included in the slot may be modified in various manners.

Figure 2:
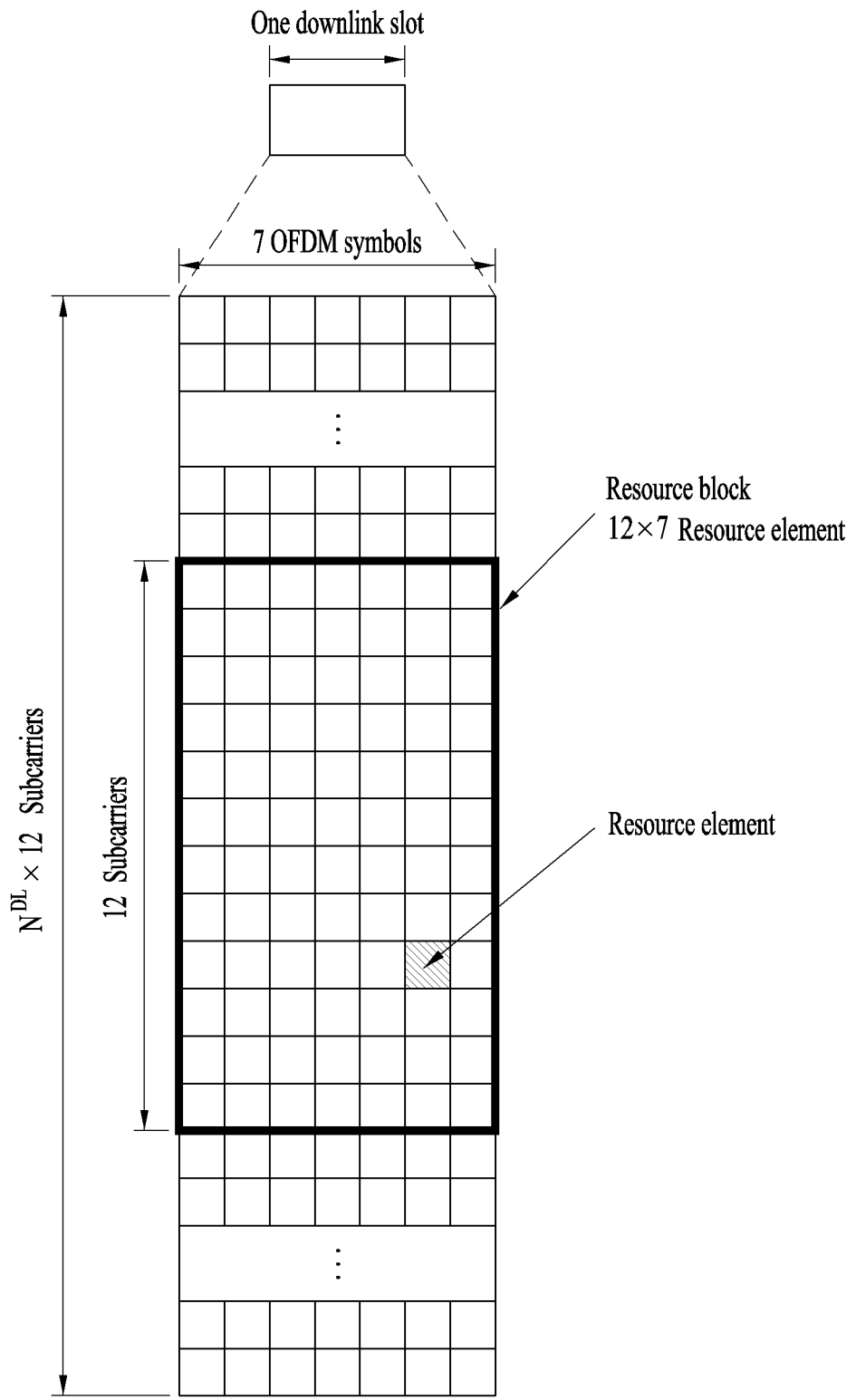
FIG. 2 illustrates resource grid for one downlink slot.

FIG. 2 illustrates resource grid for one downlink slot.

In FIG. 2, a downlink slot includes a plurality of OFDM symbols in time domain. It is described herein that one downlink slot includes 7 OFDM symbols, and one resource block (RB) includes 12 subcarriers in frequency domain as an example. However, the present invention is not limited thereto. Each element on the resource grid is referred to as a resource element (RE). One RB includes 12×7 REs. The number NDL of RBs included in the downlink slot depends on a downlink transmit bandwidth. The structure of an uplink slot may be same as that of the downlink slot.

Figure 3:
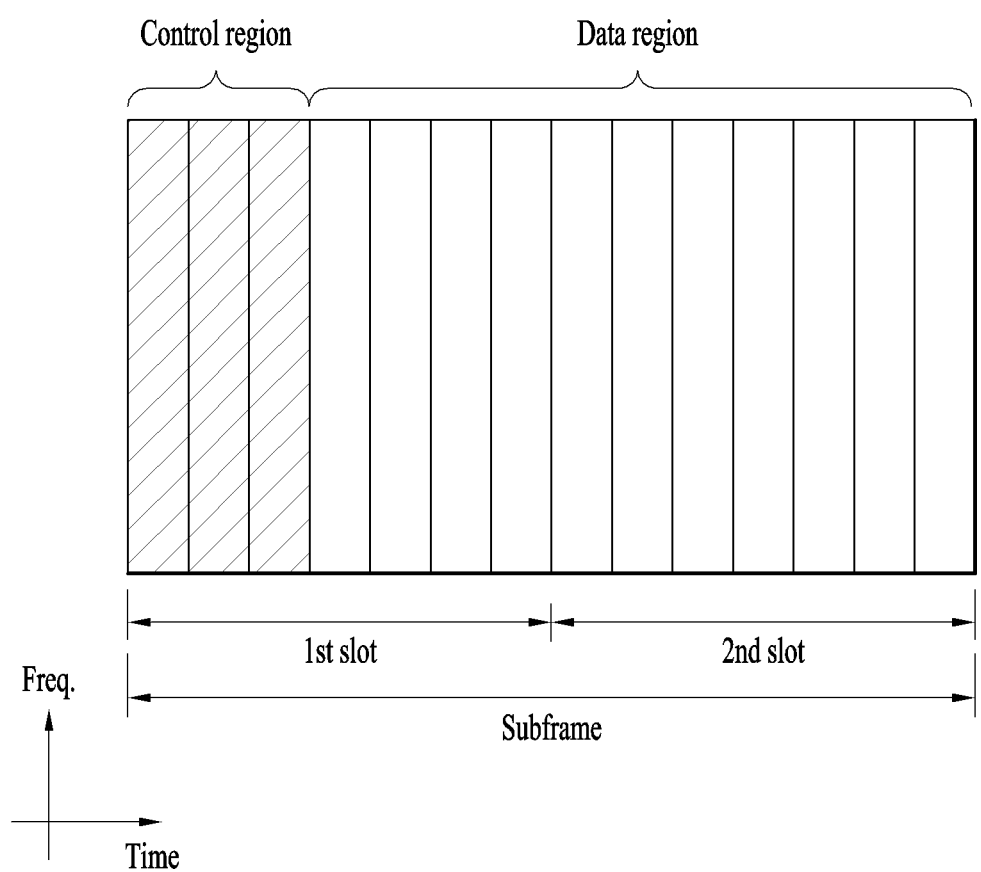
FIG. 3 illustrates structure of downlink subframe.

FIG. 3 illustrates structure of downlink subframe.

In FIG. 3, a maximum of three OFDM symbols, located in a front portion of a first slot within a subframe correspond to a control region to be assigned with a control channel. The remaining OFDM symbols correspond to a data region to be assigned with a physical downlink shared chancel (PDSCH). Examples of downlink control channels used in the 3GPP LTE includes a physical control format indicator channel (PCFICH), a physical downlink control channel (PDCCH), a physical hybrid ARQ indicator channel (PHICH), etc. The PCFICH is transmitted at a first OFDM symbol of a subframe and carries information regarding the number of OFDM symbols used for transmission of control channels within the subframe. The PHICH is a response of uplink transmission and carries an HARQ acknowledgment (ACK)/not-acknowledgment (NACK) signal. Control information transmitted through the PDCCH is referred to as downlink control information (DCI). The DCI includes uplink or downlink scheduling information or includes an uplink transmit (Tx) power control command for arbitrary UE groups.

The PDCCH may carry a transport format and a resource allocation of a downlink shared channel (DL-SCH), resource allocation information of an uplink shared channel (UL-SCH), paging information on a paging channel (PCH), system information on the DL-SCH, a resource allocation of an upper-layer control message such as a random access response transmitted on the PDSCH, a set of Tx power control commands on individual UEs within an arbitrary UE group, a Tx power control command, activation of a voice over IP (VoIP), etc. A plurality of PDCCHs can be transmitted within a control region. The UE can monitor the plurality of PDCCHs. The PDCCH is transmitted on an aggregation of one or several consecutive control channel elements (CCEs). The CCE is a logical allocation unit used to provide the PDCCH with a coding rate based on a state of a radio channel. The CCE corresponds to a plurality of resource element groups (REGs). A format of the PDCCH and the number of bits of the available PDCCH are determined according to a correlation between the number of CCEs and the coding rate provided by the CCEs. The BS determines a PDCCH format according to a DCI to be transmitted to the UE, and attaches a cyclic redundancy check (CRC) to control information. The CRC is masked with a unique identifier (referred to as a radio network temporary identifier (RNTI)) according to an owner or usage of the PDCCH. If the PDCCH is for a specific UE, a unique identifier (e.g., cell-RNTI (C-RNTI)) of the UE may be masked to the CRC. Alternatively, if the PDCCH is for a paging message, a paging indicator identifier (e.g., paging-RNTI (P-RNTI)) may be masked to the CRC. If the PDCCH is for system information (more specifically, a system information block (SIB) to be described below), a system information identifier and a system information RNTI (SI-RNTI) may be masked to the CRC. To indicate a random access response that is a response for transmission of a random access preamble of the UE, a random access-RNTI (RA-RNTI) may be masked to the CRC.

Figure 4:
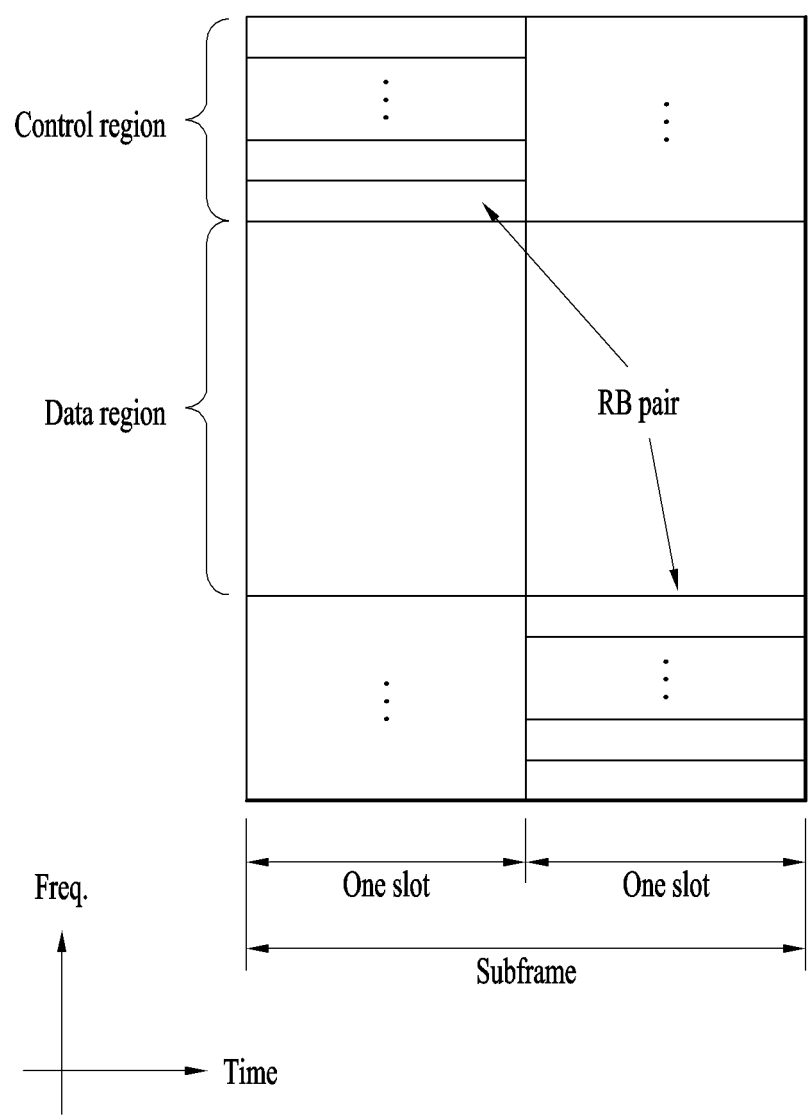
FIG. 4 illustrates structure of uplink subframe.

FIG. 4 illustrates structure of uplink subframe.

In FIG. 4, an uplink subframe can be divided in a frequency domain into a control region and a data region. The control region is allocated with a physical uplink control channel (PUCCH) for carrying uplink control information. The data region is allocated with a physical uplink shared channel (PUSCH) for carrying user data. To maintain a single carrier property, one UE does not simultaneously transmit the PUCCH and the PUSCH. The PUCCH for one UE is allocated to an RB pair in a subframe. RBs belonging to the RB pair occupy different subcarriers in respective two slots. This is called that the RB pair allocated to the PUCCH is frequency-hopped in a slot boundary.

Figure 5:
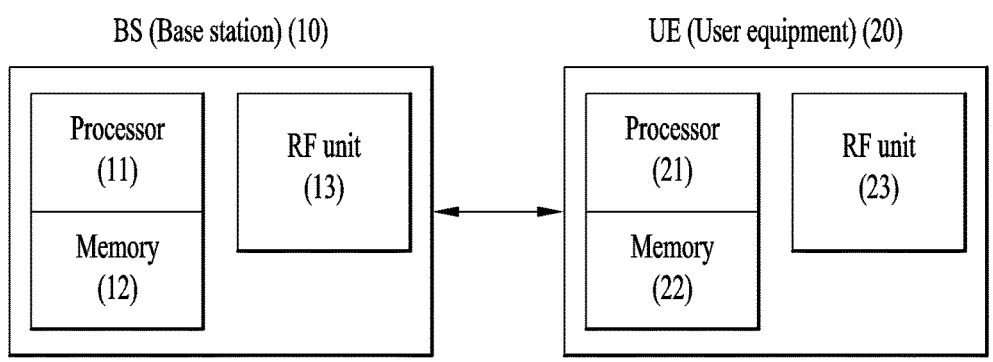
FIG. 5 illustrates system for implementing present invention.

FIG. 5 illustrates system for implementing present invention.

In FIG. 5, a wireless communication system includes a BS 10 and one or more UE 20. In downlink, a transmitter may be a part of the BS 10, and a receiver may be a part of the UE 20. In uplink, a transmitter may be a part of the UE 20, and a receiver may be a part of the BS 10. A BS 10 may include a processor 11, a memory 12, and a radio frequency (RF) unit 13. The processor 11 may be configured to implement proposed procedures and/or methods described in this application. The memory 12 is coupled with the processor 11 and stores a variety of information to operate the processor 11. The RF unit 13 is coupled with the processor 11 and transmits and/or receives a radio signal. A UE 20 may include a processor 21, a memory 22, and a RF unit 23. The processor 21 may be configured to implement proposed procedures and/or methods described in this application. The memory 22 is coupled with the processor 21 and stores a variety of information to operate the processor 21. The RF unit 23 is coupled with the processor 21 and transmits and/or receives a radio signal. The BS 10 and/or the UE 20 may have single antenna and multiple antennas. When at least one of the BS 10 and the UE 20 has multiple antennas, the wireless communication system may be called as multiple input multiple output (MIMO) system.

Component Carrier Aggregation in LTE-A

Figure 6:
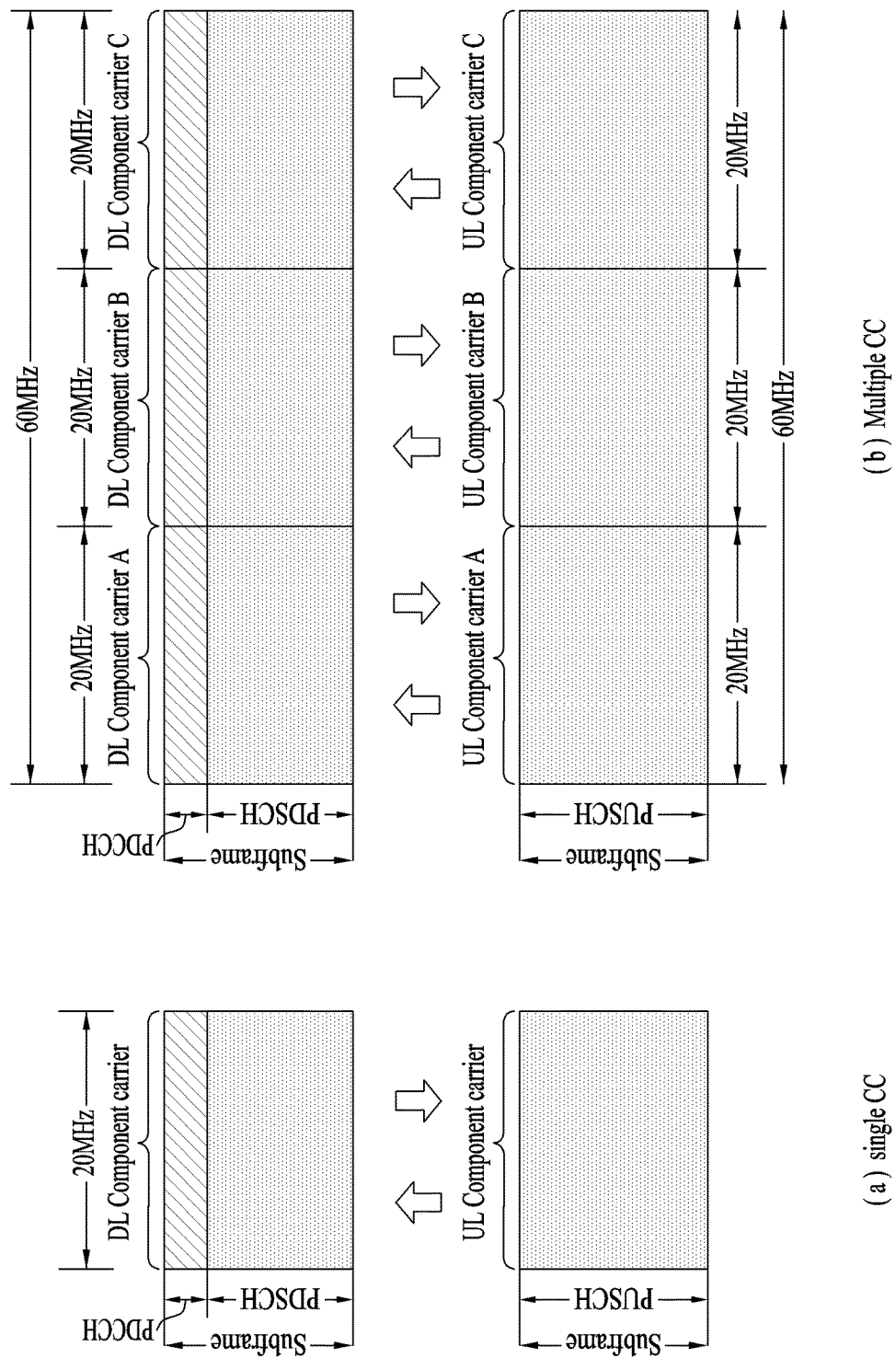
FIG. 6 illustrates subframe structure of 3GPP LTE Release-8 system and LTE-A system with CC aggregation.

FIG. 6 illustrates subframe structure of 3GPP LTE Release-8 system and LTE-A system with CC aggregation.

As the increased demands for the high data rate transmission, the mobile communication system composed of aggregated multiple CCs (component carriers) is now being researched. For example, FIG. 6 (b) illustrates the DL/UL subframe structure considered in 3GPP LTE-A (LTE Advanced) system where multiple CCs are aggregated (in this example, 3 carriers exist), while FIG. 6 (a) illustrates a single carrier operation as in conventional systems. As shown in FIG. 6 (b), a UE can monitor and receive DL signal/data from multiple DL CCs at the same time. However, even if a cell is managing N DL CCs, the network may configure a UE with M DL CCs where M≤N so that the UE's monitoring of the DL signal/data is limited to those M DL CCs. In addition, the network may configure L DL CCs as the main DL CCs from which the UE should monitor/receive DL signal/data with a priority, either UE-specifically or cell-specifically, where L≤M≤N. In this case, CCs can be classified by a cell and can be represented as the equivalent concept.

Figure 7:
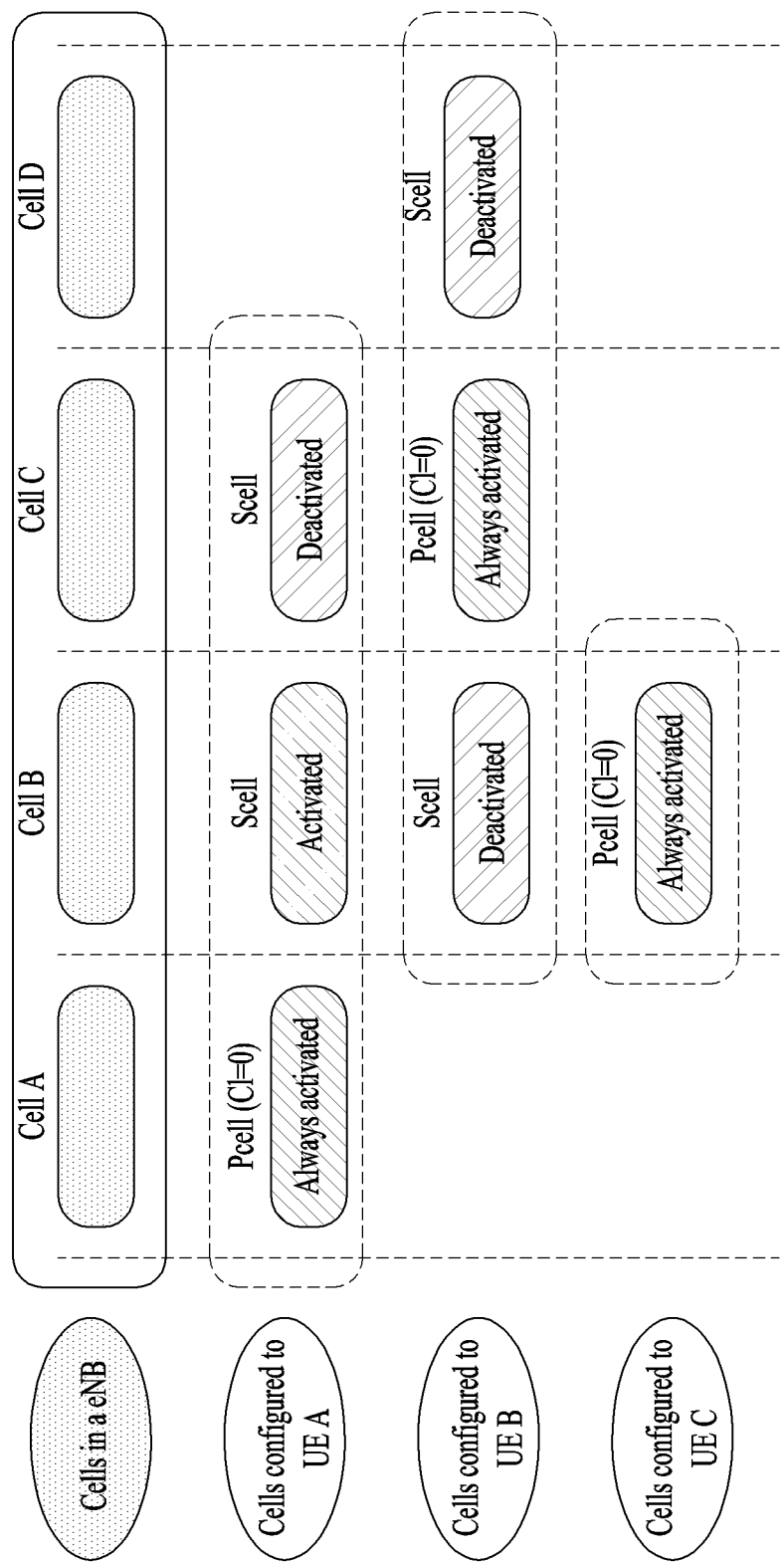
FIG. 7 illustrates configured cell, activated cell, de-activated cell.

FIG. 7 illustrates configured cell, activated cell, de-activated cell.

In a system supporting carrier aggregation, cells can be classified as shown in FIG. 7. As shown in FIG. 7, a configured cell corresponds to a cell configured to perform carrier aggregation based on a measurement report among cells belonging to an eNB. The configured cell is configured according to a UE. The configured cell reserves a resource for transmitting ACK/NACK, which is transmitted in response to PDSCH transmission, in advance. An activated cell corresponds to a cell configured to practically transmit PDSCH/PUSCH among configured cells. The activated cell performs CSI report for transmitting PDSCH/PUSCH and SRS transmission. A de-activated cell corresponds to a cell configured not to transmit PDSCH/PUSCH according to a command of an eNB or a timer operation. In this case, CSI report and SRS transmission are terminated as well.

PDCCH Transmission

PDCCH corresponds to a downlink control channel. The PDCCH is configured to transmit control information for transmitting PDSCH/PUSCH for a specific UE and transmit a power control command for a plurality of UEs. The PDCCH occupies maximum 4 OFDM symbols in time domain and indicates the number of OFDM symbols assigned to the PDCCH using PCFICH. Meanwhile, the PDCCH is transmitted over the whole band in frequency domain and uses QPSK for modulation. A resource used for transmitting the PDCCH is referred to as a CCE (control channel element). Since a CCE includes 36 resource elements, it may be able to transmit 72 bits via a single CCE. The amount of control information transmitted to the PDCCH may vary depending on a transmission mode. Control information according to a transmission mode is regulated by a DCI format. A UE determines whether or not PDSCH/PUSCH is transmitted according to a PDCCH decoding result. In this case, PDCCH scrambling is performed using UE ID information (C-RNTI) of a corresponding UE. In particular, if a UE detects a DCI format, which is transmitted in a manner of being scrambled by a UE ID of the UE, the UE transmits PDSCH or receives PUSCH according to PDCCH control information. In general, one subframe includes a plurality of PDCCHs capable of being transmitted. Hence, it is necessary for a UE to check whether or not there is control information transmitted to the UE by performing decoding on a plurality of the PDCCHs. However, if the UE performs decoding on all of a plurality of the PDCCHs, complexity is considerably increased. Hence, it is necessary to set a limit on the number of performing decoding. When control information is transmitted via PDCCH, the control information can be transmitted in a manner of concatenating one or a plurality of CCEs with each other. This is referred to as CCE aggregation. Currently, a CCE aggregation level is permitted by 1, 2, 4 and 8. If the CCE aggregation level corresponds to 4, it indicates that control information of a corresponding UE is transmitted in a manner of concatenating 4 CCEs with each other. A UE sets limit on the decoding number according to each aggregation level. Table 1 in the following shows the decoding number according to an aggregation level.

TABLE 1

PDCCH aggregation level and decoding number

| Type | Search space $S_k^{(L)}$ | | Number of PDCCH candidates $M^{(L)}$ |
|---|---|---|---|
| | Aggregation level L | Size [in CCEs] | |
| UE-specific | 1 | 6 | 6 |
| | 2 | 12 | 6 |
| | 4 | 8 | 2 |
| | 8 | 16 | 2 |
| Common | 4 | 16 | 4 |
| | 8 | 16 | 2 |

Referring to Table 1, in case of a common type, a UE performs decoding on PDCCHs, which are transmitted by an aggregation level 4 and 8, 4 times and 2 times, respectively, to determine whether or not control information is transmitted. A specific CCE constructing PDCCH corresponds to a region commonly known to all UEs. In case of a UE-specific type, unlike the common type, a UE performs decoding on PDCCHs, which are transmitted by an aggregation level 1, 2, 4, and 8, 6, 6, 2 and 2 times, respectively, to determine whether or not control information is transmitted. In this case, a CCE is differently configured according to a UE. This can be represented as equation 1 in the following.

$$Y_k = (A \cdot Y_{k-1}) \mod D \quad \text{[Equation 1]}$$

In this case, $Y_{-1} = n_{RNTI} \neq 0$, $A = 39827$, $D = 65537$ and $k = \lfloor n_s/2 \rfloor$. $n_s$ corresponds to a slot number in a radio frame.

Physical Resource Block (PRS) Bundling

In case of a UE supporting a transmission mode 9, the UE can configure PMI/RI feedback via higher layer.

The transmission mode 9 UE to which the PMI/RI feedback is set may make an assumption on granularity of a physical resource block that applies the same precoding to PDSCH and a DM RS. In particular, the UE performs channel estimation under the assumption that the same precoding is applied to a precoding resource block group (PRG) according to a system bandwidth to enhance channel estimation capability. Table 2 in the following shows values of a PRG size according to a system bandwidth.

TABLE 2

PRG size according to system bandwidth

| System bandwidth ($N_{RB}^{DL}$) | PRG size (PRBs) |
|---|---|
| <=10 | 1 |
| 11~26 | 2 |
| 27~63 | 3 |
| 64~110 | 2 |

Channel Encoding

In a general communication system, in order to make a receiving end correct an error occurred at a channel, a transmitting end performs coding on information transmitted by the transmitting end using an error correction code and transmits the information. Having received the information, the receiving end performs demodulation on a reception signal, performs a decoding procedure on the error correction code, and restores the information. An error of the reception signal caused by a channel can be corrected by the decoding procedure. The error correction code may include various types. In the present invention, a turbo code is explained as an example of the error correction code. The turbo code consists of a recursive systematic convolution encoder and an interleaver. When the turbo code is actually implemented, an interleaver may exist to easily perform parallel decoding. QPP (quadratic polynomial permutation) is a sort of the interleaver. It is known as the QPP interleaver maintains good performance on a specific data block size only. It is known as the performance of the turbo code is getting better as a size of a data block is getting bigger. In an actual communication system, if a data block has a size equal to or greater than a prescribed size, the data block is divided into a plurality of small data blocks to easily perform encoding. A divided small data block is referred to as a code block. In general, code blocks have the same size. Yet, due to a size restriction of the QPP interleaver, one of a plurality of code blocks may have a different size. The error correction encoding procedure is performed in a unit of a determined interleaver size code block and interleaving is performed to reduce an impact of a burst error, which occurs when transmission is performed via a radio channel. The code block is transmitted in a manner of being mapped to an actual radio resource. Since the amount of radio resources used for performing actual transmission is constant, it is necessary to perform rate matching on the encoded code block to match with the amount of radio resource. In general, rate matching includes puncturing and repetition. The rate matching can be performed in such a unit of an encoded code block as WCDMA of 3GPP. As a different method, it may be able to separately perform the rate matching in a manner of dividing the encoded code block into a systematic part and a parity part.

Figure 8:
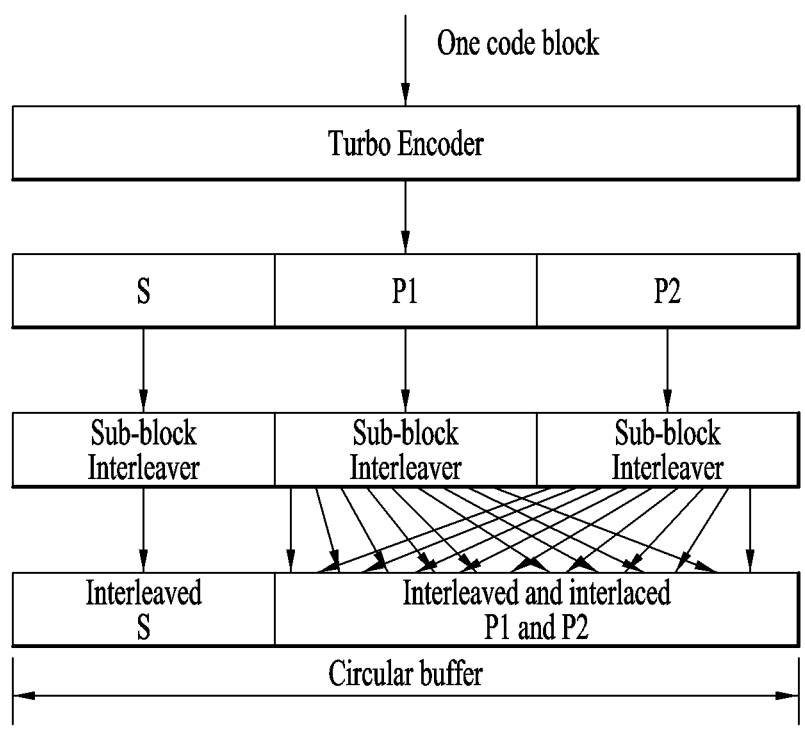
FIG. 8 illustrates rate matching block diagram.

FIG. 8 illustrates rate matching block diagram.

FIG. 8 corresponds to a block diagram for performing rate matching in a manner of dividing an encoded code block into a systematic part and a parity part. In this case, assume that a code rate corresponds to 1/3. In this case, a CRC for detecting an error is attached to a data block transmitted by higher layer. For clarity of implementation, a CRC is attached to a segmented code block as well. It is necessary to define various data block sizes according to a service type of higher layer. Yet, since it is necessary to signal the various data block sizes to a receiving end, quantization is required. When the quantization is performed, in order to match a size of a source data block transmitted by higher later with a size of a data block of a physical layer, a dummy bit is attached. When the quantization is performed, it is preferable to minimize the amount of attached dummy bits. A data block size, modulation and coding rate, and the number of allocated resources become functional relation with each other. In particular, one parameter is determined by values of other two parameters. Hence, in case of signaling parameters, it may signal two parameters only. In the following, for clarity, assume that modulation and coding rate and the number of allocated resources are used to inform a receiving end of a data block size. In this case, a pilot signal or a reference signal for channel estimation, a resource for transmitting control information, and the like may influence on the number of allocated resources according to an antenna configuration. A factor influencing on the number of allocated resources may change at every transmission instant.

Rate Matching

Figure 9:
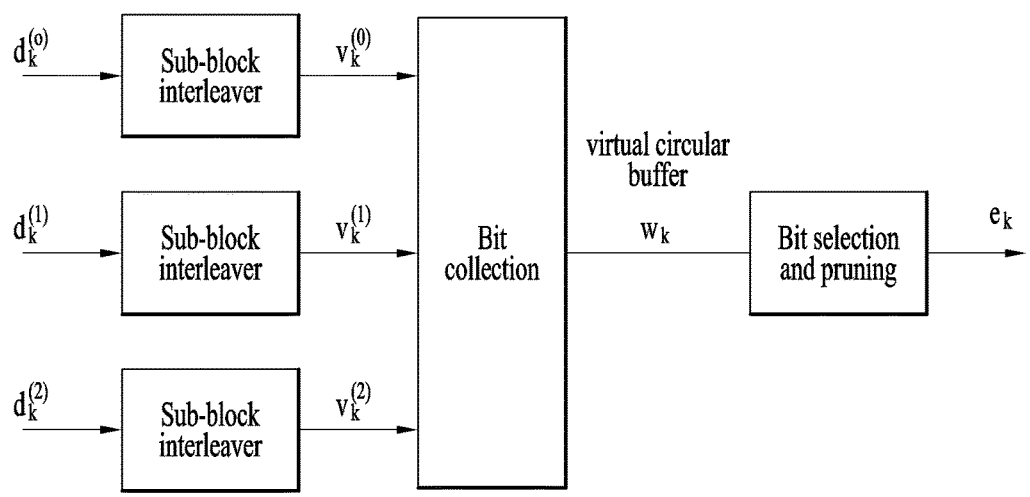
FIG. 9 illustrates rate matching for turbo coded transport channels.

FIG. 9 illustrates rate matching for turbo coded transport channels.

The rate matching for turbo coded transport channels is defined per coded block and consists of interleaving the three information bit streams $d_k^{(0)}$, $d_k^{(1)}$) and $d_k^{(2)}$, followed by the collection of bits and the generation of a circular buffer as depicted in FIG. 9. The output bits for each code block are transmitted as described in section 5.1.4.3.2 of 3GPP LTE TS 36.212 standard document.

The bit stream 4°) is interleaved according to the sub-block interleaver defined in section 5.1.4.3.1 of 3GPP LTE TS 36.212 standard document with an output sequence defined as $v_0^{(0)}$, $v_1^{(0)}$, $v_2^{(0)}$, . . . , $v_{K_\pi-1}^{(0)}$ and where $K_\pi$ is defined in section 5.1.4.3.1 of 3GPP LTE TS 36.212 standard document. The bit stream $d_k^{(1)}$ is interleaved according to the sub-block interleaver defined in section 5.1.4.3.1 of 3GPP LTE TS 36.212 standard document with an output sequence defined as $v_0^{(1)}$, $v_1^{(1)}$, $v_2^{(1)}$, . . . , $v_{K_\pi-1}^{(1)}$. The bit stream $d_k^{(2)}$ is interleaved according to the sub-block interleaver defined in section 5.1.4.3.1 with an output sequence defined as $v_0^{(2)}$, $v_1^{(2)}$, $v_2^{(2)}$, . . . , $v_{K_\pi-1}^{(2)}$.

The sequence of bits $e_k$ for transmission is generated according to section 5.1.4.3.2 of 3GPP LTE TS 36.212 standard document.

Sub-Block Interleaver

The bits input to the block interleaver are denoted by $d_0^{(i)}$, $d_1^{(i)}$, $d_2^{(i)}$, . . . , $d_{D-1}^{(i)}$, where D is the number of bits. The output bit sequence from the block interleaver is derived as follows:

(1) Assign $C_{subblock}^{TC}=32$ to be the number of columns of the matrix. The columns of the matrix are numbered 0, 1, 2, . . . , $C_{subblock}-1$ from left to right.

(2) Determine the number of rows of the matrix $R_{subblock}^{TC}$, by finding minimum integer $R_{subblock}^{TC}$ such that:

$$D \le (R_{subblock}^{TC} \times C_{subblock}^{TC})$$

The rows of rectangular matrix are numbered 0, 1, 2, . . . , $R_{subblock}^{TC}-1$ from top to bottom.

(3) If $(R_{subblock}^{TC} \times D_{subblock}^{TC}) > D)$, then $N_D = (R_{subblock}^{TC} \times D_{subblock}^{TC} - D)$ dummy bits are padded such that $y_k = <\text{NULL}>$ for $k=0, 1, \ldots, N_D-1$. Then, $y_{N_D+k} = d_k^{(i)}$, $k=0, 1, \ldots, D-1$, and the bit sequence $y_k$ is written into the $(R_{subblock}^{TC} \times C_{subblock}^{TC})$ matrix row by row starting with bit $y_0$ in column 0 of row 0:

$$\begin{bmatrix} y_0 & y_1 & y_2 & \cdots & y_{C_{subblock}^{TC}-1} \\ y_{C_{subblock}^{TC}} & y_{C_{subblock}^{TC}+1} & y_{C_{subblock}^{TC}+2} & \cdots & y_{2C_{subblock}^{TC}-1} \\ \vdots & \vdots & \vdots & \ddots & \vdots \\ y_{(R_{subblock}^{TC}-1) \times C_{subblock}^{TC}} & y_{(R_{subblock}^{TC}-1) \times C_{subblock}^{TC}+1} & y_{(R_{subblock}^{TC}-1) \times C_{subblock}^{TC}+2} & \cdots & y_{(R_{subblock}^{TC} \times C_{subblock}^{TC}-1)} \end{bmatrix}$$

For $d_k^{(0)}$ and $d_k^{(1)}$:

(4) Perform the inter-column permutation for the matrix based on the pattern $\langle P(j) \rangle_{j \in \{0, 1, \ldots, C_{subblock}^{TC}-1\}}$ that is shown in table 3, where P(j) is the original column position of the j-th permuted column. After permutation of the columns, the inter-column permuted $(R_{subblock}^{TC} \times C_{subblock}^{TC})$ matrix is equal to $$\begin{bmatrix} y_{P(0)} & y_{P(1)} & y_{P(2)} & \cdots & y_{P(C_{subblock}^{TC}-1)} \\ y_{P(0)+C_{subblock}^{TC}} & y_{P(1)+C_{subblock}^{TC}} & y_{P(2)+C_{subblock}^{TC}} & \cdots & y_{P(C_{subblock}^{TC}-1)+C_{subblock}^{TC}} \\ \vdots & \vdots & \vdots & \ddots & \vdots \\ y_{P(0)+(R_{subblock}^{TC}-1) \times C_{subblock}^{TC}} & y_{P(1)+(R_{subblock}^{TC}-1) \times C_{subblock}^{TC}} & y_{P(2)+(R_{subblock}^{TC}-1) \times C_{subblock}^{TC}} & \cdots & y_{P(C_{subblock}^{TC}-1)+(R_{subblock}^{TC}-1) \times C_{subblock}^{TC}} \end{bmatrix}$$

(5) The output of the block interleaver is the bit sequence read out column by column from the inter-column permuted $(R_{subblock}^{TC} \times C_{subblock}^{TC})$ matrix. The bits after sub-block interleaving are denoted by $v_0^{(i)}, v_1^{(i)}, v_2^{(i)}, \ldots, v_{K_\pi-1}^{(i)}$, where $v_0^{(i)}$ corresponds to $y_{P(0)}$, $v_1^{(i)}$ to $y_{P(0)+C_{subblock}^{TC}} \ldots$ and $K_\pi = (R_{subblock}^{TC} \times C_{subblock}^{TC})$.

For $d_k^{(2)}$:

(4) The output of the sub-block interleaver is denoted by $v_0^{(2)}, v_1^{(2)}, v_2^{(2)}, \ldots, v_{K_\pi-1}^{(2)}$, where $v_k^{(2)} = y_{\pi(k)}$ and where $$\pi(k) = \left( P\left( \left\lfloor \frac{k}{R_{subblock}^{TC}} \right\rfloor \right) + C_{subblock}^{TC} \times (k \bmod R_{subblock}^{TC}) + 1 \right) \bmod K_\Pi$$

The permutation function P is defined in Table 3.

TABLE 3

Inter-column permutation pattern for sub-block interleaver.

| Number of columns $C_{subblock}^{TC}$ | Inter-column permutation pattern <P(0), P(1), . . . , P($C_{subblock}^{TC}$ − 1)> |
|---|---|
| 32 | <0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31> |

Bit Collection, Selection and Transmission

The circular buffer of length $K_w = 3K_\pi$ for the r-th coded block is generated as follows:

$w_k = v_k^{(0)}$ for $k=0, \ldots, K_\pi-1$ $w_{K_\pi+2k} = v_k^{(1)}$ for $k=0, \ldots, K_\pi-1$ $w_{K_\pi+2k+1} = v_k^{(2)}$ for $k=0, \ldots, K_\pi-1$ Denote the soft buffer size for the transport block by $N_{IR}$ bits and the soft buffer size for the r-th code block by $N_{cb}$ bits. The size $N_{cb}$ is obtained as follows, where C $$N_{cb} = \min\left( \left\lfloor \frac{N_{IR}}{C} \right\rfloor, K_w \right)$$

is the number of code blocks computed in section 5.1.2:
    for DL-SCH transport channels
    $N_{cb} = K_w$ for UL-SCH transport channels
where $N_{IR}$ is equal to:

$$N_{IR} = \left\lfloor \frac{N_{soft}}{K_C \cdot K_{MIMO} \cdot \min(M_{DL\_HARQ}, M_{limit})} \right\rfloor$$

where:
$N_{soft}$ is the total number of soft channel bits [FFS].
$K_{MIMO}$ is equal to 2 if [FFS condition], and is equal to 1 otherwise.
$M_{DL\_HARQ}$ is the maximum number of DL HARQ processes as defined in section 7 of [3].
$M_{limit}$ is a constant equal to [FFS].

Denoting by E the rate matching output sequence length for the r-th coded block, and $rv_{idx}$ the redundancy version number for this transmission ($rv_{idx}=0, 1, 2$ or 3), the rate matching output bit sequence is $e_k$, $k=0, 1, \ldots, E-1$.

Define by G the total number of bits available for the transmission of one transport block.

Set $G' = G/(N_L \cdot Q_m)$ where $Q_m$ is equal to 2 for QPSK, 4 for 16QAM, 6 for 64QAM, and where
    For transmit diversity:
        $N_L$ is equal to 2,
    Otherwise:
        $N_L$ is equal to the number of layers a transport block is mapped onto
Set $y = G'$ mod C, where C is the number of code blocks computed in section 5.1.2.
if $r \leq C-\gamma-1$
    set $E = N_L \cdot Q_m \cdot \lfloor G'/C \rfloor$
else
    set $E = N_L \cdot Q_m \cdot \lceil G'/C \rceil$
end if
Set $$k_0 = R_{subblock}^{TC} \cdot \left( 2 \cdot \left\lceil \frac{N_{cb}}{8 R_{subblock}^{TC}} \right\rceil \cdot rv_{idx} + 2 \right),$$

where $R_{subblock}^{TC}$ is the number of rows defined in section 5.1.4.1.1.
Set $k=0$ and $j=0$
while $\{k<E\}$
    if $w_{(k_0+j) \bmod N_{cb}} \neq$ <NULL>
        $e_k = w_{(k_0+j) \bmod N_{cb}}$
        $k = k+1$
    end if
    $j = j+1$
end while Since a mother code rate of a legacy turbo code corresponds to 1/3, performance degradation occurs compared to 1/5. When a turbo code of a code rate 1/5 is used to obtain an enhanced coding gain, it is necessary to newly design a channel coding gain.

In the present invention, assume that a turbo encoder of a mother coder rate 1/5 is introduced.

Figure 10:
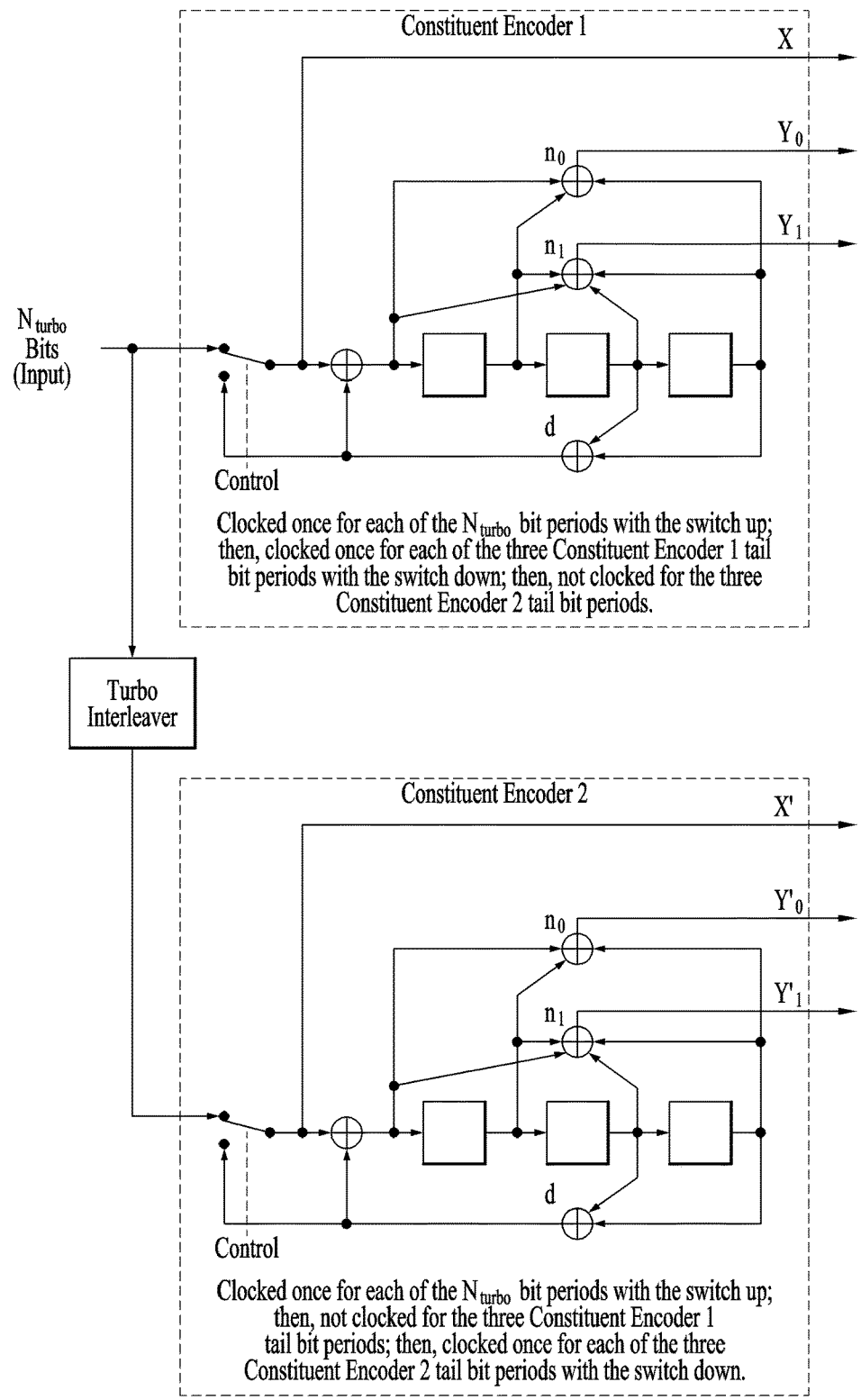
FIG. 10 is a diagram for a structure of 1/5 turbo encoder.

FIG. 10 is a diagram for a structure of 1/5 turbo encoder.

In FIG. 10, X corresponds to a systematic bit stream and Y0, Y1, Y0', and Y1' correspond to a parity bit stream. The 1/5 turbo encoder can be used in a manner of being divided into a mother coder are 1/3 and 1/5 according to a size of a code block (CB) or a size of a transport block (TB). In particular, if the size of the CB or the size of the TB is equal to or smaller than a specific threshold, the mother code rate 1/5 is used. If the size of the CB or the size of the TB is greater than the specific threshold, the mother code rate 1/3 can be applied.

In particular, encode the information block with mother code rate 1/5 turbo encoder, if CB size or TB size $<=K_{th}$.

Encode the information block with mother code rate 1/3 turbo encoder, if CB size or TB size $>K_{th}$.

When HARQ is applied on the basis of the aforementioned reference, it may be preferable to make a mother code rate, which is to be used for retransmission, to be identical to a mother code rate used for initial transmission.

Trellis Termination

In order to easily restore information data which is encoded using the encoder mentioned earlier in FIG. 9, it may be preferable to set shift registers of two constituent encoders to 0 at the timing at which transmission of an information packet is terminated. This is called trellis termination. If trellis termination is performed on the encoder mentioned earlier in FIG. 9, since 3 bits are respectively outputted from X, Y0, Y1, X', Y0', and Y1' bit sequences, total 18 bits output tail bit is generated (e.g., X0(0), X0(1), X0(2), Y0(0), Y0(1), Y0(2), Y1(0), Y1(1), Y1(2), X'(0), X'(1), X'(2), Y0'(0), Y0'(1), Y0'(2), Y'(0), Y'(0), Y'(1), Y'(2)). Since an encoded bit is processed by X, Y0, Y1, Y0', Y1' bit sequences, when the 18-bit tail bit is deployed to 5 encoded bit sequences, it may consider methods described in the following.

Method 1: method of deploying (4, 4, 4, 3, 3) number of tail bits to (X, Y0, Y1, Y0', Y1') bit sequences It is preferable to allocate 4 tail bits to a systematic bit stream X. When 3 tail bits are allocated to a bit stream, the last of the bit stream is represented as <NULL> to match a length of each bit stream.

4 tail bits are allocated to parity bit sequences Y0 and Y0' and 3 tail bits are allocated to Y1 and Y1'.

Embodiment

Bit stream X: X(0), Y1'(0), Y0'(1), X'(2)
Bit stream Y0: Y0(0), X(1), Y1'(1), Y0'(2)
Bit stream Y1: X'(0), Y1(1), Y0(2), <NULL>
Bit stream Y0': Y1(0), Y0(1), X(2), Y1'(2)
Bit stream Y1': Y0'(0), X'(1), Y1(2), <NULL>

4 tail bits are allocated to parity bit sequences Y0 and Y1 and 3 tail bits are allocated to Y0' and Y1'.

Embodiment

Bit stream X: X(0), Y1'(0), Y0'(1), X'(2)
Bit stream Y0: Y0(0), X(1), Y1'(1), Y0'(2)
Bit stream Y1: Y1(0), Y0(1), X(2), Y1'(2)
Bit stream Y0': X'(0), Y1(1), Y0(2), <NULL>
Bit stream Y1': Y0'(0), X'(1), Y1(2), <NULL>

Method 2: Method of deploying (4, 4, 4, 4, 4) number of tail bits to (X, Y0, Y1, Y0', Y1') bit sequences X and X' corresponding to systematic bits of each constituent encoder are repeated as much as 1 bit.

Embodiment

Bit stream X: X(0), X'(0), Y1(1), Y0(2)
Bit stream Y0: X(0), Y'0(0), X'(1), Y1(2)
Bit stream Y1: Y0(0), Y'1(0), Y0'(1), X'(2)
Bit stream Y0': Y1(0), X(1), Y1'(1), Y0'(2)
Bit stream Y1': X'(0), Y0(1), X(2), Y1'(2)

Sub-Block Interleaver

Figure 11:
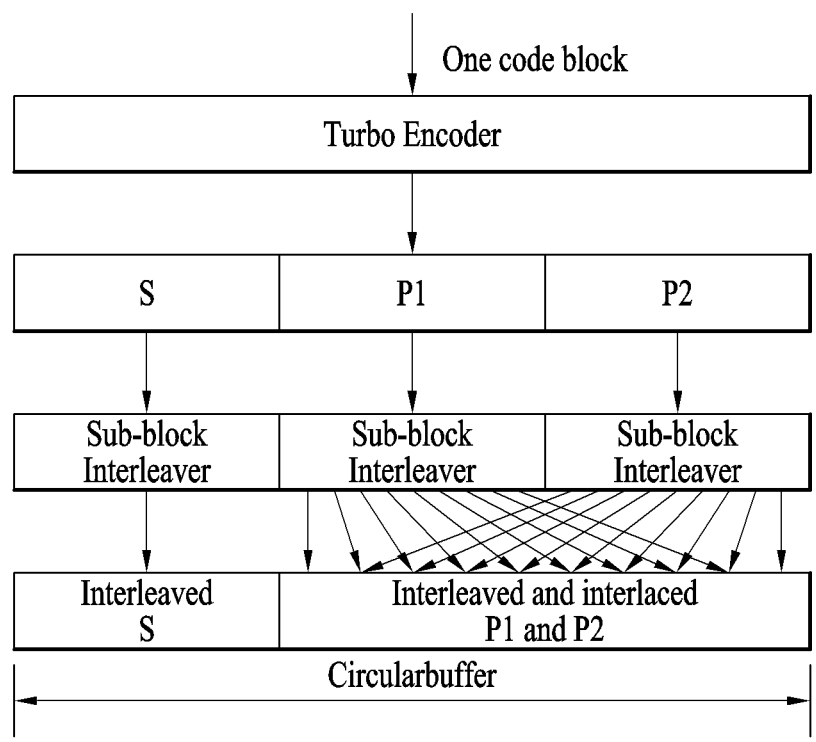
FIG. 11 illustrates an interleaving block diagram of 1/3 turbo encoder.

FIG. 11 illustrates an interleaving block diagram of 1/3 turbo encoder.

As shown in FIG. 11, bit sequences X0, Y0, and Y0' generated by a turbo encoder of mother code rate 1/3 are inputted to a sub-block interleaver. In this case, (S, P1, P2) of FIG. 11 corresponds to (X, Y0, Y0') of FIG. 10.

In case of 1/5 turbo encoder, since two parity sequences are additionally generated, interleaving can be performed using methods described in the following.

Method 1: method of performing interleaving using a block interleaver corresponding to R1×64 matrixes (number of columns corresponds to 64) by grouping parity sequences by 2 (R1 corresponds to a positive integer that varies according to a length of an encoded bit stream)

Parity Stream Grouping
(P1, P2)/(P3, P4)
(P1, P3)/(P2, P4)

Interleaver input order when (Pw, Px)/(Py, Pz) grouping is performed: Pw, Px, Py, Pz indicate a parity stream.

Both Pw and Py are inputted to an interleaver in row-wise and then Px or Py is inputted in row-wise.

Pw or Py is 1 row inputted and then Px or Pz is 1 row inputted in turn.

Method 2: method of performing interleaving using a block interleaver corresponding to R2×32 matrixes (number of columns corresponds to 32) on each of parity sequences (R2 corresponds to a positive integer that varies according to a length of an encoded bit stream).

When a mother code rate is changed according to a size of CB or TB, if encoding is performed using mother code rate 1/5, since the total number of columns becomes 32×5=160, a circular buffer of a size corresponding to R3×160 (R3 is a positive integer) is configured. In this case, the size of the circular buffer can be determined according to a size of CB or TB corresponding to a mother code rate 1/3. In case of using a mother code rate 1/3 encoder, since the number of columns of a circular buffer corresponds to 96, a circular buffer of a size corresponding to R2×96 is configured. Hence, it is necessary to satisfy such a relation as R3×160<=R2×96.

Method 3: The method 3 may operate as shown in a block diagram of FIG. 12 described in the following. When a mother code rate is changed according to a size of CB or TB, if encoding is performed using mother code rate 1/5, the total number of columns may become 96. Hence, the number of columns of a sub-block interleaver through which encoded bit sequences of S, P1, P2, P3, and P4 are passing may correspond to 20 or 18. Since 5 encoded bit sequences are passing through 96 columns, it may be able to configure a sub-block interleaver of a different size based on a relation such as 20+20+20+18+18=96 and it may be then able to perform interleaving on each of the encoded bit sequences.

FIG. 12 is a diagram for a method of storing a bit stream generated by 1/5 turbo encoder in a circular buffer.

Bit Collection

Referring to FIG. 11, bit sequences X0, Y0, Y1, Y0', and Y1', which are generated via an encoder, are stored in a circular buffer via a sub-block interleaver.

FIG. 12 shows a method of storing an encoded bit stream in a circular buffer. In (a) option 1 of FIG. 12 and (b) option 2 of FIG. 12, each of (X, Y0, Y0', Y1, Y1') of FIG. 10 is mapped to (S, P1, P2, P3, P4), respectively. A sub-block interleaver of each encoded bit stream corresponds to a block interleaver including a form of R×32 matrixes that the number of columns corresponds to 32. When the interleaver is inputted, the interleaver is inputted in row-wise. When the interleaver is outputted, the interleaver is outputted in column-wise. In this case, the R may vary depending on a length of each bit stream. The last row of a block interleaver of each bit stream may not be fully filled depending on the amount of encoded bits. In this case, although <NULL> is inputted and outputted to/from the interleaver and is written on the circular buffer, the last row is not actually transmitted.

FIG. 12 (a) shows a method of preferentially transmitting a parity bit stream configured by 1/3 turbo encoder. Parity bit sequences P1 and P2, which include a parity as much as a length R, are alternately stored in the buffer and then parity bit sequences P3 and P4 are alternately stored in the buffer. FIG. 15 (b) shows a structure that parity bit sequences P1, P2, P3, and P4 of 1/5 turbo encoder are sequentially stored in the buffer.

Redundancy Version (RV) Starting Position

In case of using a turbo encoder of 1/3 code rate, an RV starting position can be calculated as equation 2 described in the following.

$$k_0 = R_{subblock}^{TC} \cdot \left(2 \cdot \left\lceil \frac{N_{cb}}{8R_{subblock}^{TC}} \right\rceil \cdot rv_{idx} + 2\right) \quad \text{[Equation 2]}$$

In this case, $N_{cb}$ corresponds to a size of a code block and is given as equation 3 in the following, $rv_{idx}$ has values of 0, 1, 2, and 3, and $R_{subblock}^{TC}$ corresponds to the number of rows of a sub-block interleaver.

$$N_{cb} = \min\left(\left\lfloor \frac{N_{IR}}{C} \right\rfloor, K_w\right) \quad \text{[Equation 3]}$$

And, $$N_{IR} = \left\lfloor \frac{N_{soft}}{K_C \cdot K_{MIMO} \cdot \min(M_{DL\_HARQ}, M_{limit})} \right\rfloor,$$

C corresponds to the number of code blocks, Kw corresponds to the number of encoded bits of a code block, $N_{soft}$ corresponds to a value which is given according to a UE category, and Kc corresponds to the number of aggregated component carriers. In case of a transmission mode transmitting two TBs, $K_{MIMO}$ corresponds to 2. Otherwise, $K_{MIMO}$ corresponds to 1. $M_{DL\_HARQ}$ corresponds to the number of HQRQ processes and $M_{limit}$ corresponds to 8 which is a constant number.

As shown in equation 2, if $N_{cb}$=Kw is assumed, an RV starting position becomes 2 $R_{subblock}^{TC}$, 26 $R_{subblock}^{TC}$, 50 $R_{subblock}^{TC}$, 74 $R_{subblock}^{TC}$ according to a value of the $rv_{idx}$. This is because, if a parity bit is transmitted instead of a systematic bit with a high code rate, it is effective to enhance performance. Since the number of parities using 1/5 turbo encoder is increased to 4, it is preferable to determine the RV starting position in consideration of the number of parities.

If equation 2 is applied to the calculation of the RV starting position of the 1/5 turbo encoder shown in FIG. 12 (b), since parity bit sequences P1 and P2 are transmitted as much as $R_{subblock}^{TC}$, all parity bit sequences are not transmitted, thereby occurring performance degradation. In order to preferentially transmit all parity bit sequences, as shown in equation 4 in the following, it may be preferable to change the equation for calculating the RV starting position.

$$k_0 = R_{subblock}^{TC} \cdot \left(2 \cdot \left\lceil \frac{N_{cb}}{8R_{subblock}^{TC}} \right\rceil \cdot rv_{idx} + 4\right) \quad \text{[Equation 4]}$$

As shown in equation 4, parity bit sequences P1, P2, P3 and P4 are transmitted as much as $R_{subblock}^{TC}$ in the initial transmission, thereby enhancing performance. If a mother code rate is changed according to a size of CB or TB, DCI (downlink control information) indicating an RV can indicate a different position according to a mother code rate used in the initial transmission. In particular, it may be able to represent the equation 4 as $$k_0 = R_{subblock}^{TC} \cdot \left(2 \cdot \left\lceil \frac{N_{cb}}{8R_{subblock}^{TC}} \right\rceil \cdot rv_{idx} + 4\right)$$

using the RV starting position, if CB size or TB size $<=K_{th}$ (where, $K_{th}$ is a prescribed threshold). And, it may be able to represent the equation 2 as $$k_0 = R_{subblock}^{TC} \cdot \left(2 \cdot \left\lceil \frac{N_{cb}}{8R_{subblock}^{TC}} \right\rceil \cdot rv_{idx} + 2\right)$$

using the RV starting position, if CB size or TB size $>K_{th}$.

As a different method, in the foregoing description related to the sub-block interleaver, in case of using the interleaver mentioned earlier in the method 3, it may be able to calculate the RV starting position using equation 2.

Soft Buffer Management

In the equation 3, the $N_{soft}$ corresponds to a value which is determined according to a UE category. If 1/5 turbo encoder is used, a parity increases. Hence, it is required to increase the amount of memories of a UE. In this case, the amount of memories used for 1/3 turbo encoder can be identically allocated to the $N_{soft}$ of 1/5 turbo encoder. In particular, if the amount of memories is reduced, although it is able to reduce complexity of a UE, it may fail to retransmit a partial parity bit.

In case of using the bit collection scheme shown in FIG. 12 (a), it may have performance identical to performance capable of being obtained by using 1/3 turbo encoder. Although a specific operation mode uses 1/5 turbo encoder, if the amount of memories used for 1/3 turbo encoder is identically allocated to the 1/5 turbo encoder, it may be able to reuse a legacy turbo decoder and reduce complexity.

In the following, a tail biting convolutional code (TBCC) coding scheme of a new RAT (NR) system is proposed. First of all, similar to FIG. 13, assume that a TBCC has a mother code rate 1/3. And, assume that a sub-block interleaver generates the same interleaving pattern using the same parameter.

Figure 13:
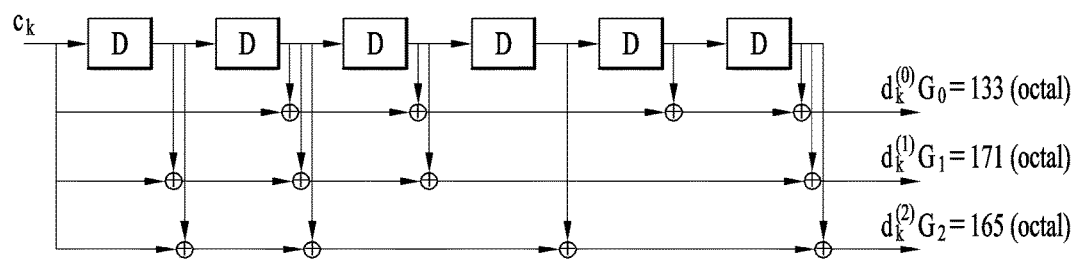
FIG. 13 is a diagram for an example of a coding scheme of a mother code rate 1/3 TBCC encoder.

FIG. 13 is a diagram for an example of a coding scheme of a mother code rate 1/3 TBCC encoder.

When a downlink data is transmitted, it is necessary to perform a rate matching (puncturing or repetition) operation to transmit data corresponding to a coding rate different from 1/3 coding rate. If a mother code rate 1/3 is assumed in FIG. 13, parity bit sequences d0(k), d1(k), and d2(k) are generated in response to an input bit $c_k$. In particular, 3N bit output coded bits such as d0(k), d1(k), d2(k), k=0, 1, . . . , (N−1) are generated in response to N bit input $c_k$, k=0, 1, . . . , (N−1). In case of performing rate matching, it may be able to enhance decoding capability of a receiver using the principle described in the following.

Puncturing:

In case of transmitting data of a coding rate greater than a coding rate 1/3, it may be preferable to perform puncturing on the same amount of coded bits in the parity bit sequence d0(k), d1(k), and d2(k). If the amount of bit sequences to be punctured corresponds to a multiple of 3, it may be preferable to perform puncturing on the same amount of coded bits in each parity bit sequence. If the amount of bit sequences to be punctured is not a multiple of 3, it may be preferable to determine the amount of puncturing in a manner that the amount of coded bits to be punctured in each parity bit sequence has a maximum 1 bit difference. In case of performing puncturing on each parity bit sequence, it may be preferable to uniformly perform puncturing on a parity bit sequence. And, in order not to perform puncturing on parity bit sequences at the same time in response to the same input bit, it may be able to designate an offset value rather than 0 to a puncturing start point of each parity sequence. For example, the d0(k) performs puncturing on coded bits with the same interval at k=k1. The d1(k) starts to perform puncturing at k=k1+offset and performs puncturing on coded bits with the same interval. The d2(k) starts to perform puncturing at k=k1+2*offset and performs puncturing on coded bits with the same interval. In case of supporting HARQ, it is preferable to generate a different redundancy version whenever transmission is performed. Hence, it is preferable to perform puncturing by making a start position of the puncturing to be different from a start position of puncturing of the initial transmission. For example, if the d0(k) starts to perform puncturing at k=k1 in the initial transmission, it may be able to configure the d0(k) to start puncturing at k=k1+f(retx_num) in case of performing retransmission. In this case, f(retx_num) corresponds to a value differently configured according to the count of retransmission. Similarly, the d1(k) and the d2(k) can start to perform puncturing at k=k1+offset+f(retx_num) and k=k1+2*offset+f(retx_num), respectively. In this case, the f(retx_num) function applied to each bit stream may have the same value or a different value.

Repetition:

In case of transmitting data of a coding rate smaller than a coding rate 1/3, it may be preferable to repeat the same amount of coded bits in the parity bit sequence d0(k), d1(k), and d2(k). If the amount of bit sequences to be repeated corresponds to a multiple of 3, it may be preferable to repeat the same amount of coded bits in each parity bit sequence. If the amount of bit sequences to be repeated is not a multiple of 3, it may be preferable to determine the amount of repetition in a manner that the amount of coded bits to be repeated in each parity bit sequence has a maximum 1 bit difference. In case of repeating each parity bit sequence, it may be preferable to uniformly perform repetition on a parity bit sequence. And, in order not to repeat parity bit sequences at the same time in response to the same input bit, it may be able to designate an offset value rather than 0 to a repetition start point of each parity sequence. For example, the d0(k) repeats coded bits with the same interval at k=k1. The d1(k) starts to perform repetition at k=k1+offset and repeats coded bits with the same interval. The d2(k) starts to perform repetition at k=k1+2*offset and repeats coded bits with the same interval. In case of supporting HARQ, it is preferable to generate a different redundancy version whenever transmission is performed. Hence, it is preferable to perform repetition by making a start position of the repetition to be different from a start position of repetition of the initial transmission. For example, if the d0(k) starts to perform puncturing at k=k1 in the initial transmission, it may be able to configure the d0(k) to start puncturing at k=k1+f(retx_num) in case of performing retransmission. In this case, f(retx_num) corresponds to a value differently configured according to the count of retransmission. Similarly, the d1(k) and the d2(k) can start to perform repetition at k=k1+offset+f(retx_num) and k=k1+2*offset+f(retx_num), respectively. In this case, the f(retx_num) function applied to each bit stream may have the same value or a different value.

The aforementioned rate matching operation can be identically applied when 1/5 mother code rate is assumed.

The rate matching operation can be performed based on the aforementioned principle at a front end and a rear end of a sub-block interleaver. If sub-block interleaver output and circular buffer rate matching are operated together by interlacing the sub-block interleaver output with the circular buffer rate matching, it may be able to make parity bits to be uniformly punctured or repeated. In particular, in case of $K_w=3K_\pi$, $w_{3k}=v_k^{(0)}$ for $k=0, \ldots, K_\pi-1$ $w_{3k+1}=v_k^{(1)}$ for $k=0, \ldots, K_\pi-1$ $w_{3k+2}=v_k^{(2)}$ for $k=0, \ldots, K_\pi-1$ Sub-block interleaver output bit sequence is stored in the circular buffer in an interleaved parity bit order. Since a bit lastly stored in the circular buffer is punctured first and a bit firstly stored in the circular buffer is repeated, it may be able to implement uniform puncturing or repetition.

When a mother code rate corresponds to 1/5, it may also be able to make parity bits to be uniformly punctured or repeated by connecting a sub-block interleaver with an output end of each parity bit and interlacing an output of the sub-block interleaver with the output end of each parity bit. In particular, in case of $K_w=5K_\pi$, $w_{5k}=v_k^{(0)}$ for $k=0, \ldots, K_\pi-1$ $w_{5k+1}=v_k^{(1)}$ for $k=0, \ldots, K_\pi-1$ $w_{5k+2}=v_k^{(2)}$ for $k=0, \ldots, K_\pi-1$ $w_{5k+3}=v_k^{(3)}$ for $k=0, \ldots, K_\pi-1$ $w_{5k+4}=v_k^{(4)}$ for $k=0, \ldots, K_\pi-1$ In case of supporting HARQ, when retransmission is performed, it may be able to obtain an incremental redundancy gain by transmitting a redundancy version different from new transmission. In this case, rate matching can be implemented using a circular buffer rate matching (CBRM) scheme. As shown in FIG. 9, the rate matching can be performed in a manner that a parity bit stream is concatenated, a circular buffer is transmitted from the begging, and bits are transmitted as many as bits capable of being transmitted in a physical layer. Hence, if data of a coding rate equal to or greater than 2/3 is transmitted, d2(k) is not transmitted. In case of supporting the CBRM, in order to support HARQ, configuring a different redundancy version becomes equivalent to designating a data transmission starting point whenever transmission is performed. The methods of designating a start point whenever transmission is performed are described in the following. Assume that a mother code rate corresponds to 1/3.

Method 1: If a data block size N is encoded, output bit sequences of 3*N bits are generated. In this case, start points as many as the number of redundancy versions are determined with the same interval. For example, if the N corresponds to 120 bits, encoded bits as many as 360 bits are generated. If the number of redundancy versions corresponds to 4, start points are designated with an interval of 360/4=90 bits. Hence, when retransmission is performed, a random start point is selected from among the start points to perform transmission. In particular, $1^{st}$ bit, $91^{st}$ bit, $181^{st}$ bit, and $271^{st}$ bit become start points of transmission when retransmission is performed. When the start points are respectively mapped to RV0, RV1, RV2, and RV3, if a coding rate of initial transmission corresponds to 2/3, an optimized RV pattern may have such a form as RV0=>RV2=>RV0=>RV2. If a coding rate corresponds to 1/2, the optimized RV pattern may have such a form as RV0=>RV2=>RV1=>RV0=>RV2=>RV1.

Method 2: When retransmission is performed, it may be able to perform transmission immediately after data transmission. For example, if N corresponds to 120 bits, encoded bits as many as 360 bits are generated. If 240 bits are transmitted at the initial transmission, 240 bits are transmitted from $241^{st}$ bit at next transmission. In this case, a bit transmitted after the last $360^{th}$ bit transmits $1^{st}$ bit using a circulation scheme.

If a data block size (e.g., code block size or transport block size) is equal to or greater than a specific value in NR system, data block transmission is performed using an encoder of mother code rate 1/3. If the data block size is smaller than the specific value, it may be able to configure a data block to be transmitted using an encoder of mother code rate 1/5 or 1/6. By doing so, it may be able to produce high throughput with restricted complexity. In this case, the encoder of mother code rate 1/3 and the encoder of mother code rate 1/5 or 1/6 may correspond to a different coding scheme. For example, a low-density parity-check (LDPC) code of the mother code rate 1/3 is used for a data block equal to or greater than a specific value and a turbo code of the mother code rate 1/5 or 1/6 can be applied to a data block smaller than the specific value.

In case of the LDPC, it may use a different LDPC code based on a data block size (e.g., code block size or transport block size) and code rate. LDPC code 1 supports code rate r (r11≤r≤r12), the data block size K (K11≤K≤K12) may be supported. LDPC code 2 supports code rate r (r21≤r≤r22), the data block size K (K21≤K≤K22) may be supported. A range of code rate and data block size of LDPC code 1 may overlapped with range of code rate and data block size of LDPC code 2, r12 may be greater than r22. In case data block size is small than a prescribed size, performance of codeword generated from LDPC code having low mother code rate is good. On the other hand, when the data block size is small, it can satisfy the fine granularity of the data block size by using different LDPC code when it needs to support a high code rate. For example, assume that a code rate covered by two LDPC codes is as follows. (LDPC code 1: 1/3≤r≤0.93, LDPC code 2: 1/5≤r≤2/3, where r is a code rate) The maximum code rate 0.93 supported by LDPC code 1 can be obtained by puncturing the mother codeword. In this case, if a data block size equal to or less than a specific value and a code rate are equal to or less than 2/3), the LPDC 2 is used. On the contrary, although the data block size is equal to or less than the specific value, if the code rate is greater than 2/3), it may be able to define to use the LDPC code 1. In particular, it may consider using two encodes in consideration of both the data block size and the code rate.

Another way to consider the application of LDPC code 1 and LDPC code 2 is to use the MCS index as another metric that represents the code rate. According to the LTE standard, an MCS index is defined as shown in Table A below. If a MCS index of MCS indexes indicating the same modulation is large, the code rate is increased. Therefore, when the MCS index is smaller than the specific MCS index indicating the same modulation, the LDPC code 2 is applied. If the MCS index is larger than the specific MCS index, the encoding method for applying the LDPC code 1 can be considered. Therefore, LDPC code 2 is applied when code block size or transport block size is less than a specific value and smaller than a specific MCS index for a specific modulation. Otherwise, an encoding method for applying LDPC code 1 may be considered. In this way, even if the modulation scheme is changed, an encoding method that applies LDPC code 1 and LDPC 2 based on a specific MCS index may be used. However, when using a specific modulation, the minimum code block size or transport block size may be more than a specific value. In this case, it is preferable to encode using LDPC code 1.

TABLE A

Modulation and TBS index table for PDSCH

| MCS Index $I_{MCS}$ | Modulation Order $Q_m$ | TBS Index $I_{TBS}$ |
|---|---|---|
| 0 | 2 | 0 |
| 1 | 2 | 1 |
| 2 | 2 | 2 |

TABLE A-continued

Modulation and TBS index table for PDSCH

| MCS Index $I_{MCS}$ | Modulation Order $Q_m$ | TBS Index $I_{TBS}$ |
|---|---|---|
| 3 | 2 | 3 |
| 4 | 2 | 4 |
| 5 | 2 | 5 |
| 6 | 2 | 6 |
| 7 | 2 | 7 |
| 8 | 2 | 8 |
| 9 | 2 | 9 |
| 10 | 4 | 9 |
| 11 | 4 | 10 |
| 12 | 4 | 11 |
| 13 | 4 | 12 |
| 14 | 4 | 13 |
| 15 | 4 | 14 |
| 16 | 4 | 15 |
| 17 | 6 | 15 |
| 18 | 6 | 16 |
| 19 | 6 | 17 |
| 20 | 6 | 18 |
| 21 | 6 | 19 |
| 22 | 6 | 20 |
| 23 | 6 | 21 |
| 24 | 6 | 22 |
| 25 | 6 | 23 |
| 26 | 6 | 24 |
| 27 | 6 | 25 |
| 28 | 6 | 26 |
| 29 | 2 | reserved |
| 30 | 4 | |
| 31 | 6 | |

The above-described embodiments may correspond to combinations of elements and features of the present invention in prescribed forms. And, it may be able to consider that the respective elements or features may be selective unless they are explicitly mentioned. Each of the elements or features may be implemented in a form failing to be combined with other elements or features. Moreover, it may be able to implement an embodiment of the present invention by combining elements and/or features together in part. A sequence of operations explained for each embodiment of the present invention may be modified. Some configurations or features of one embodiment may be included in another embodiment or can be substituted for corresponding configurations or features of another embodiment. And, it is apparently understandable that a new embodiment may be configured by combining claims failing to have relation of explicit citation in the appended claims together or may be included as new claims by amendment after filing an application.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for processing a data block by a user equipment in a wireless communication system, the method comprising:

generating tail bits of 18 bits by performing trellis termination in a turbo encoder included in the user equipment of code rate 1/5 containing a plurality of constituent encoders; and deploying the tail bits of 18 bits to 5 encoded bit sequences of the turbo encoder included in the user equipment based on a prescribed rule, wherein 4 tail bits are deployed to a systematic bit sequence among the 5 encoded bit sequences based on the prescribed rule, and 4 tail bits are deployed to each of specific 2 parity bit sequences among 4 parity bit sequences based on the prescribed rule, and wherein when the turbo encoder included in the user equipment of code rate 1/5 is used, a redundancy version (RV) starting position applied to the turbo encoder included in the user equipment is determined by an equation A in the following, $$k_0 = R_{subblock}^{TC} \cdot \left(2 \cdot \left\lceil \frac{N_{cb}}{8R_{subblock}^{TC}} \right\rceil \cdot rv_{idx} + 4\right)$$ [Equation A]

where, $N_{cb}$ is a size of a code block, $rv_{idx}$ has values of 0, 1, 2, or 3, and $R_{subblock}^{TC}$ is a number of rows of a sub-block interleaves, and wherein the 4 parity bit sequences of the code block are transmitted initially as much as $R_{subblock}^{TC}$, thereby enhancing performance.

2. The method of claim 1, wherein 3 tail bits are deployed to each of the remaining 2 parity bit sequences, or
wherein 1 bit related to a systematic bit of a first constituent encoder among a plurality of the constituent encoders is further deployed to a first parity bit sequence among the remaining 2 parity bit sequences and 1 bit related to a systematic bit of a second constituent encoder is further deployed to a second parity bit sequence.

3. The method of claim 1, further comprising:
grouping in a unit of 2 parity bit sequences among the 4 parity bit sequences;
performing interleaving and interlacing on parity bits per group.

4. The method of claim 1, further comprising:
performing interleaving and interlacing on all parity bits by grouping the 4 parity bit sequences as a group.

5. A user equipment for processing a data block in a wireless communication system, the user equipment comprising:
a processor configured to generate tail bits of 18 bits by performing trellis termination in a turbo encoder included in the user equipment of code rate 1/5 containing a plurality of constituent encoders, the processor configured to deploy the tail bits of 18 bits to 5 encoded bit sequences of the turbo encoder based on a prescribed rule, wherein 4 tail bits are deployed to a systematic bit sequence among the 5 encoded bit sequences based on the prescribed rule, and 4 tail bits are deployed to each of specific 2 parity bit sequences among 4 parity bit sequences based on the prescribed rule, and wherein when the turbo encoder included in the user equipment of code rate 1/5 is used, a redundancy version (RV) starting position applied to the turbo encoder included in the user equipment is determined by an equation A in the following, $$k_0 = R_{subblock}^{TC} \cdot \left(2 \cdot \left\lceil \frac{N_{cb}}{8R_{subblock}^{TC}} \right\rceil \cdot rv_{idx} + 4\right)$$ [Equation A]

where, $N_{cb}$ is a size of a code block, $rv_{idx}$ has values of 0, 1, 2, or 3, and $R_{subblock}^{TC}$ is a number of rows of a sub-block interleaver, and wherein the 4 parity bit sequences of the code block are transmitted initially as much as $R_{subblock}^{TC}$, thereby enhancing performance.

6. The user equipment of claim 5, wherein the processor is configured to further deploy 3 tail bits to the remaining 2 parity bit sequences, or
wherein the processor is configured to further deploy 1 bit related to a systematic bit of a first constituent encoder among a plurality of the constituent encoders to a first parity bit sequence among the remaining 2 parity bit sequences and further deploy 1 bit related to a systematic bit of a second constituent encoder to a second parity bit sequence.

7. The user equipment of claim 5, wherein the processor is configured to:
group in a unit of 2 parity bit sequences among the 4 parity bit sequences; and
perform interleaving and interlacing on parity bits per group.

8. The user equipment of claim 5, wherein the processor is configured to perform interleaving and interlacing on all parity bits by grouping the 4 parity bit sequences as a group.

* * * * *